(12) United States Patent
Lee

(10) Patent No.: US 11,315,746 B2
(45) Date of Patent: Apr. 26, 2022

(54) OPTICAL SWITCH KEYBOARD ADJUSTMENT METHOD AND OPTICAL SWITCH KEYBOARD USING THE SAME

(71) Applicant: Darfon Electronics Corp., Taoyuan (TW)

(72) Inventor: Chien-Hsin Lee, New Taipei (TW)

(73) Assignee: Darfon Electronics Corp., Taoyuan (TW)

( * ) Notice: Subject to any disclaimer, the term of this patent is extended or adjusted under 35 U.S.C. 154(b) by 0 days.

(21) Appl. No.: 17/097,105

(22) Filed: Nov. 13, 2020

(65) Prior Publication Data

US 2021/0202193 A1 Jul. 1, 2021

(30) Foreign Application Priority Data

Dec. 31, 2019 (TW) .................................. 108148752
Jan. 21, 2020 (CN) .......................... 202010068368.7

(51) Int. Cl.
| | |
|---|---|
| *H01H 13/83* | (2006.01) |
| *H01H 13/02* | (2006.01) |
| *H03K 17/94* | (2006.01) |
| *H03K 17/969* | (2006.01) |
| *H03K 17/795* | (2006.01) |
| *H03K 3/42* | (2006.01) |

(52) U.S. Cl.
CPC .......... *H01H 13/83* (2013.01); *H01H 13/023* (2013.01); *H03K 3/42* (2013.01); *H03K 17/7955* (2013.01); *H03K 17/943* (2013.01); *H03K 17/969* (2013.01); *H01H 2013/026* (2013.01); *H03K 2217/94102* (2013.01)

(58) Field of Classification Search
CPC .. H01H 13/83; H01H 13/023; H03K 17/7955; H03K 17/943; H03K 17/969
USPC ....................................................... 250/206.1
See application file for complete search history.

(56) References Cited

U.S. PATENT DOCUMENTS

2020/0178365 A1* 6/2020 Lin ........................ H05B 45/20

FOREIGN PATENT DOCUMENTS

| CN | 101922966 A | 12/2010 |
|---|---|---|
| CN | 103197357 A | 7/2013 |
| CN | 103941310 A | 7/2014 |
| CN | 107219515 A | 9/2017 |
| WO | 2018192393 A1 | 10/2018 |

* cited by examiner

*Primary Examiner* — Tomi Skibinski

(57) ABSTRACT

A method for adjusting an optical switch keyboard and an optical switch keyboard using the adjusting method are provided. The optical switch keyboard has a number of key units. The method includes the following steps. A scan signal is applied to one of a number of scan lines by a control unit at a first scan time point. A light is emitted by a light source according to the scan signal. A light emitted by the light source is detected by a detecting element to generate a detecting electric signal. The detecting electric signal is read by the control unit to obtain a first read signal voltage. When the first read signal voltage is outside the voltage range of the pressed state of the key unit, the period of the scan signal is increased by a first predetermined amount by the control unit to obtain an adjusted scan signal.

27 Claims, 9 Drawing Sheets

OPTICAL SWITCH KEYBOARD ADJUSTMENT METHOD AND OPTICAL SWITCH KEYBOARD USING THE SAME

This application claims the benefit of Taiwan application Serial No. 108148752, filed Dec. 31, 2019, and People's Republic of China application Serial No. 202010068368.7, filed Jan. 21, 2020 the subject matter of which is incorporated herein by reference.

BACKGROUND OF THE DISCLOSURE

Field of the Disclosure

The disclosure relates in general to a keyboard, and more particularly to a method for adjusting an optical switch keyboard and an optical switch keyboard using the adjusting method.

Description of the Related Art

Since the optical switch keyboard is operated through a light generated by a light source (such as a light-emitting diode) and a corresponding detecting element (such as a phototransistor), the control unit of the optical switch keyboard needs to periodically apply a scan signal to one of a plurality of scan lines to activate the light source, such that the detecting element can determine whether any key is pressed according to whether the light emitted by the light source is received by the detecting element. Relevant technologies of the optical switch keyboard still have some problems to overcome. For example, after the light source (such as an infrared light-emitting diode (IR LED)) emits a scanning light over a long period of time, the illuminating efficiency decrease and the light intensity reduces, and the high voltage interval of the detecting electric signal generated by the detecting element will be shortened or delayed. Thus, when the control unit reads the detecting electric signal whose voltage level is erroneously lowered, the control unit will misjudge and determine that the key unit is not pressed.

Therefore, it has become a prominent task for the industries to provide a new method for adjusting an optical switch keyboard and an optical switch keyboard using the adjusting method to overcome the problems mentioned above.

SUMMARY OF THE DISCLOSURE

The disclosure is directed to a method for adjusting an optical switch keyboard and an optical switch keyboard using the adjusting method, which can make the control unit read correct voltage, so that the control unit can correctly determine whether the key unit is pressed.

For achieve the purpose mentioned above, a method for adjusting an optical switch keyboard is provided. The optical switch keyboard has a key unit. The adjusting method includes the following steps. A scan signal is applied to one of a number of scan lines by a control unit at a first scan time point. A light is emitted by a light source according to the scan signal. The light is detected by a detecting element to generate a detecting electric signal. The detecting electric signal is read by the control unit to obtain a first read signal voltage. When the first read signal voltage is outside a voltage range of the pressed state of the key unit, the control unit increases the period of the scan signal by a first predetermined amount to obtain an adjusted scan signal.

Preferably, when the first read signal voltage is outside the voltage range of the pressed state, the first predetermined amount is a predetermined percentage of the period of the scan signal being unadjusted.

Preferably, the method further includes the following steps. After the adjusted scan signal is obtained, according to the adjusted scan signal, the step of emitting the light by the light source is performed again according to the scan signal.

Preferably, when the first read signal voltage is outside the voltage range of the pressed state, the control unit makes the optical switch keyboard activate a correction mode. When the first read signal voltage is inside the voltage range of the pressed state, the control unit makes the optical switch keyboard terminate the correction mode.

Preferably, the method further includes the following steps. When the first read signal voltage is inside the voltage range of the pressed state and the optical switch keyboard terminates the correction mode, the control unit records the period of the adjusted scan signal.

Preferably, the method further includes the following steps. When the control unit does not increase the period of the scan signal, the control unit reads the detecting electric signal at a time point being the first scan time point plus a delay period to obtain the first read signal voltage. After the control unit increases the period of the scan signal. The control unit increases the length of the delay period by a second predetermined amount to obtain an adjusted delay period. (1) The step of emitting the light by the light source according to the scan signal is performed again; and (2) the step of reading the detecting electric signal by the control unit at a time point being the first scan time point plus the adjusted delay period is performed again.

Preferably, the method further includes the following steps, when the control unit does not increase the period of the scan signal, the control unit reads the detecting electric signal at a time point being the first scan time point plus a delay period to obtain a first read signal voltage. After the control unit increases the period of the scan signal, (1) the step of emitting the light by the light source according to the scan signal is performed again, and (2) reading the detecting electric signal at least twice by the control unit at a time point being the first scan time point plus a multiple of a real number of the length of the delay period to obtain at least the first read signal voltage and a second read signal voltage is performed again.

Preferably, when the first read signal voltage and the second read signal voltage both are outside the voltage range of the pressed state, the optical switch keyboard activates the correction mode, and when at least one of the first read signal voltage and the second read signal voltage is inside the voltage range of the pressed state, the optical switch keyboard terminates the correction mode.

The disclosure further provides a method for adjusting an optical switch keyboard having a key unit. The method includes the following steps. A scan signal is applied to one of a number of scan lines by a control unit at a first scan time point. A light is emitted by a light source according to the scan signal. The light is detected by a detecting element to generate a detecting electric signal. The detecting electric signal is read by the control unit at a time point being the first scan time point plus a delay period to obtain a first read signal voltage. When the first read signal voltage is outside a voltage range of the pressed state of the key unit, the control unit increases the length of the delay period by a second predetermined amount to obtain an adjusted delay period.

Preferably, when the first read signal voltage is outside the voltage range of the pressed state, the second predetermined amount is a predetermined percentage of the length of the delay period being unadjusted.

Preferably, the method further includes the following steps. After the adjusted delay period is obtained, according to the adjusted delay period, the step of emitting the light by the light source according to the scan signal is performed again and the step of reading the detecting electric signal by the control unit at a time point being the first scan time point plus the adjusted delay period is performed again.

Preferably, when the first read signal voltage is outside the voltage range of the pressed state, the control unit makes the optical switch keyboard activate a correction mode. When the first read signal voltage is inside the voltage range of the pressed state, the control unit makes the optical switch keyboard terminate the correction mode.

Preferably, the method further includes the following steps. When the first read signal voltage is inside the voltage range of the pressed state and the optical switch keyboard terminates the correction mode, the control unit records the length of the adjusted delay period.

The disclosure further provides an optical switch keyboard. The optical switch keyboard includes a number of scan lines, a control unit, and a number of key units. The control unit is coupled to the scan lines. The control unit applies a scan signal to one of the scan lines. Any one of the key units includes a light source and a detecting element. The light source is configured to emit a light according to the scan signal. When the detecting element detects the light, the detecting element generates a detecting electric signal, and the control unit reads the detecting electric signal to obtain a first read signal voltage. When the first read signal voltage is outside a voltage range of the pressed state of one of the key units, the control unit increases the period of the scan signal by a first predetermined amount to obtain an adjusted scan signal.

Preferably, when the first read signal voltage is outside the voltage range of the pressed state, the first predetermined amount is a predetermined percentage of the period of the scan signal being unadjusted.

Preferably, after the adjusted scan signal is obtained, the light source emits the light according to the scan signal again.

Preferably, when the first read signal voltage is outside the voltage range of the pressed state, the control unit makes the optical switch keyboard activate a correction mode. When the first read signal voltage is inside the voltage range of the pressed state, the control unit makes the optical switch keyboard terminate the correction mode.

Preferably, when the first read signal voltage is inside the voltage range of the pressed state and the optical switch keyboard terminates the correction mode, the control unit records the period of the adjusted scan signal.

Preferably, when the control unit does not increase the period of the scan signal, the control unit reads the detecting electric signal at a time point being the first scan time point plus a delay period to obtain a first read signal voltage. After the control unit increases the period of the scan signal, the control unit increases the length of the delay period by a second predetermined amount to obtain an adjusted delay period, and (1) the step of emitting the light by the light source according to the scan signal is performed again, and (2) the step of reading the detecting electric signal by the control unit at a time point being the first scan time point plus the delay period is performed again.

Preferably, when the control unit does not increase the period of the scan signal, the control unit reads the detecting electric signal at the first scan time point plus a delay period to obtain a first read signal voltage. After the control unit increases the period of the scan signal, the followings are performed again: (1) the step of emitting the light by the light source according to the scan signal, and (2) reading the detecting electric signal by the control unit at least twice at a time point being the first scan time point plus a multiple of a real number of the length of the delay period to obtain at least the first read signal voltage and a second read signal voltage.

Preferably, when the first read signal voltage and the second read signal voltage both are outside the voltage range of the pressed state, the optical switch keyboard activates the correction mode. When at least one of the first read signal voltage and the second read signal voltage is inside the voltage range of the pressed state, the optical switch keyboard terminates the correction mode.

Preferably, the control unit includes an analog-to-digital conversion circuit. The control unit reads the detecting electric signal through the analog-to-digital conversion circuit.

The disclosure further provides an optical switch keyboard. The optical switch keyboard includes a number of scan lines, a control unit, and a number of key units. The control unit is coupled to the scan lines. The control unit applies a scan signal to one of the scan lines at a first scan time point. Any one of the key units includes a light source and a detecting element. The light source is configured to emit a light according to the scan signal. When the detecting element detects the light, the detecting element generates a first read signal voltage. The control unit reads the first read signal voltage at a second time point. The second time point and the first scan time point are separated by a delay period. When the first read signal voltage is outside a voltage range of the pressed state of one of the key units, the control unit increases the length of the delay period by a second predetermined amount to obtain an adjusted delay period.

Preferably, when the first read signal voltage is outside the voltage range of the pressed state, the second predetermined amount is a predetermined percentage of the length of the delay period being unadjusted.

Preferably, after the adjusted delay period is obtained, the light source emits the light again according to the scan signal, and the control unit reads the detecting electric signal at a time point being the first scan time point plus the adjusted delay period.

Preferably, when the first read signal voltage is outside the voltage range of the pressed state, the control unit makes the optical switch keyboard activate a correction mode. When the first read signal voltage is inside the voltage range of the pressed state, the control unit makes the optical switch keyboard terminate the correction mode.

Preferably, when the first read signal voltage is inside the voltage range of the pressed state and the optical switch keyboard terminates the correction mode, the control unit records the length of the adjusted delay period.

The above and other aspects of the invention will become better understood with regard to the following detailed description of the preferred but non-limiting embodiment (s). The following description is made with reference to the accompanying drawings.

DETAILED DESCRIPTION OF THE DISCLOSURE

Figure 1:
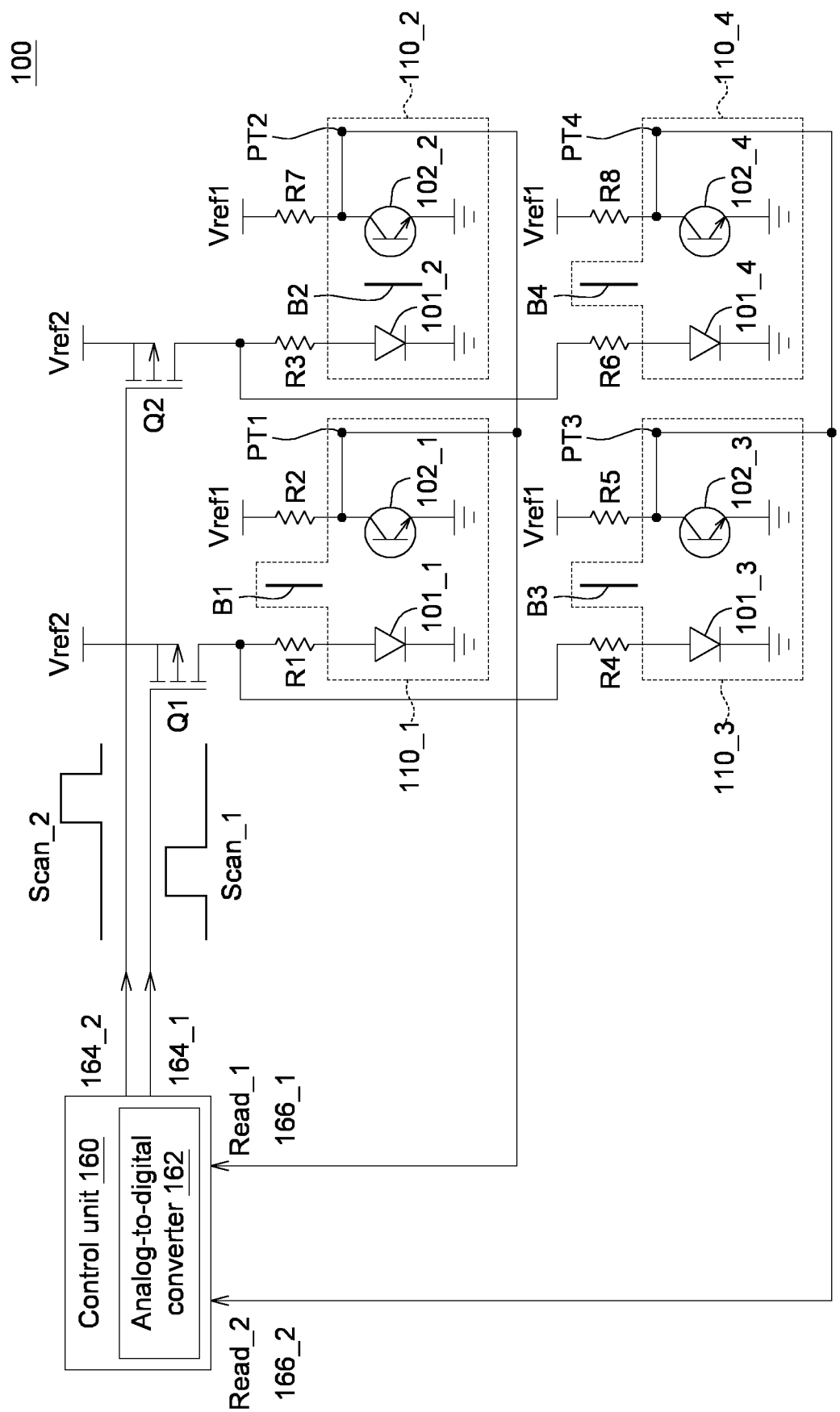
FIG. 1 is a schematic diagram of circuits of an optical switch keyboard according to an embodiment of the present disclosure.

Referring to FIG. 1, a schematic diagram of relevant circuits of an optical switch keyboard 100 according to an embodiment of the present disclosure is shown. Normally, the optical switch keyboard can be provided with more than 88 key units, more than 6 scan lines and more than 18 read lines. The 6 scan lines and the 18 read lines form a keyboard scan matrix, and each of the key units is disposed at an intersection of a scan line and a read line. As shown in FIG. 1, the optical switch keyboard is exemplified by 4 key units 110_1 to 110_4, 2 scan lines and 2 read lines, but the present disclosure is not limited thereto. The key unit 110_1 is disposed at the intersection of the scan line 164_1 and the read line 166_1, and the key unit 110_2 is disposed at the intersection of the scan line 164_2 and the read line 166_1. The key unit 110_3 is disposed at the intersection of the scan line 164_1 and the read line 166_2. The key unit 110_4 is disposed at the intersection of the scan line 164_2 and the read line 166_2. The optical switch keyboard 100 includes a number of scan lines 164_1 to 164_2, a number of read lines 166_1 to 166_2, a control unit 160 and a number of key units 110_1 to 110_4. The control unit 160 is coupled to the scan lines 164_1 to 164_2 and the read lines 166_1 to 166_2. The control unit 160 sequentially applies scan signals Scan_1 to Scan_2 to the scan lines 164_1 to 164_2. For example, the control unit 160 firstly sends a scan signal to the scan line 164_1. After the signals of the read lines are read, the control unit 160 then sends a scan signal to the scan line 164_2. Specifically, only one of the scan lines 164_1 to 164_2 is applied with a scan signal at any time to correctly read data. The key units 110_1 to 110_4 include light sources 101_1 to 101_4 and detecting elements 102_1 to 102_4, respectively. Each of the light sources 101_1 to 101_4 emits a light according to the scan signals Scan_1 to Scan_2 (that is, each of the light sources 101_1 to 101_4 emits a light under the control of the scan signals Scan_1 to Scan_2). Each of the key units 110_1 to 110_4 is coupled to a first reference voltage Vref1 and a second reference voltage Vref2 through loading elements (such as the loading resistors R1 to R8) and switching elements (such as field-effect transistors (FET) or bipolar transistors). In the present embodiment, the key unit 110_1 includes a light source 101_1, a detecting element 102_1 and a light blocking element B1. For example, the light source 101_1 can be a light-emitting diode (LED), the detecting element 102_1 can be a phototransistor (PT), and the light blocking element B1 is disposed between the light-emitting diode 101_1 and the phototransistor 102_1. The cathode of the light-emitting diode 101_1 is coupled to ground, and the anode of the light-emitting diode 101_1 is coupled to a first terminal of the switching element Q1 through a loading resistor R1. The second terminal of the switching element Q1 is coupled to the second reference voltage Vref2. The control terminal of the switching element Q1 is coupled to the first scan line 164_1 to receive a corresponding scan signal Scan_1. When the switching element Q1 is a field-effect transistor, the first terminal of the switching element Q1 is one of the source and drain of the field-effect transistor, the second terminal of the switching element Q1 is another of the source and drain of the field-effect transistor, and the control terminal of the switching element Q1 is the gate of the field-effect transistor. When the switching element Q1 is a bipolar transistor, the first terminal of the switching element Q1 is one of the emitter and the collector of the bipolar transistor, the second terminal of the switching element Q1 is another of the emitter and the collector of the bipolar transistor, and the control terminal of the switching element Q1 is the base of the bipolar transistor. When the control terminal of the switch element Q1 receives the scan signal Scan_1, a current flows the first terminal and the second terminal of the switching element Q1, and the second reference voltage Vref2 supplies power to the light-emitting diode 101_1 through the loading resistor R1 to make the light-emitting diode 101_1 emit a light. The first terminal of the phototransistor 102_1 is coupled to the output terminal PT1 of the key unit 110_1. The output terminal PT1, coupled to the read line 166_1, is further coupled to the first reference voltage Vref1 through a loading resistor R2. The second terminal of the phototransistor 102_1 is coupled to ground (GND). In the present embodiment, the light-emitting diode 101_1 generates (or emits) an infrared light, and the phototransistor 102_1 generates a detecting electric signal at the output terminal PT1 according to whether the infrared light generated by the light-emitting diode 101_1 is detected (or received). When the key unit 110_1 is pressed, the light blocking element B1 shields the infrared light generated by the light-emitting diode 101_1 and causes the detecting electric signal generated at the output terminal PT1 by the phototransistor 102_1 to change. The structure of other key units is similar to the structure of the key unit 110_1. For example, the key unit 110_2 includes a light-emitting diode 101_2, a phototransistor 102_2 and a light blocking element B2 disposed between the light-emitting diode 101_2 and the phototransistor 102_2. For example, the key unit 110_3 includes a light-emitting diode 101_3, a phototransistor 102_3, and a light blocking element B3 disposed between the light-emitting diode 101_3 and the phototransistor 102_3. For example, the key unit 110_4 includes a light-emitting diode 101_4, a phototransistor 102_4, and a light blocking element B4 disposed between the light-emitting diode 101_4 and the phototransistor 102_4. The connecting relation of other key units and other loading element, other switching elements, the first reference voltage Vref1, and the second reference voltage Vref2 is similar to the connecting relation of the key unit 110_1 and the loading elements R1 and R2, the switching element Q1, the first reference voltage Vref1, and the second reference voltage Vref2, and will not be further described here.

Figure 2A:
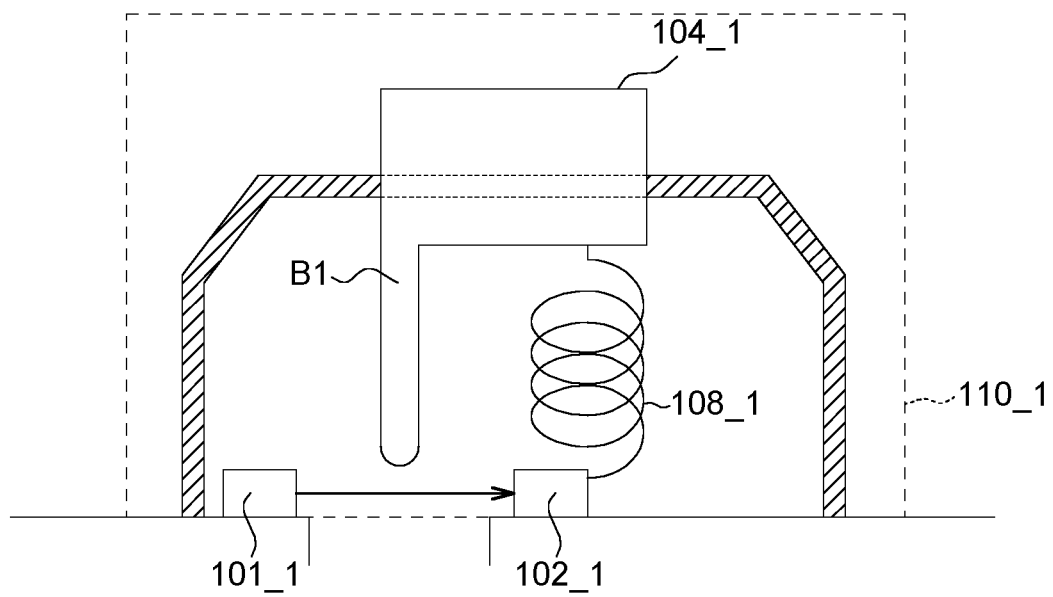
FIG. 2A is a cross-sectional view of a key unit in an un-pressed state according to an embodiment of the present disclosure.

Referring to FIG. 2A, a cross-sectional view of a key unit 110_1 in an un-pressed state according to an embodiment of the present disclosure is shown. As shown in FIG. 2A, the restoring force element 108_1 is disposed under a keycap 104_1. When the light source 101_1 emits a light according to the first scan signal Scan_1 and the user does not press the keycap 104_1, the restoring force element 108_1 lifts the keycap 104_1 upward, and synchronically causes the light blocking element B1 disposed under the keycap 104_1 to be moved upward. Thus, the infrared light emitted by the light-emitting diode 101_1 can smoothly reach the phototransistor 102_1, and the phototransistor 102_1, on detecting the infrared light, is turned on and causes the voltage of the output terminal PT1 of FIG. 1 to drop to the 0V voltage of the ground.

Figure 2B:
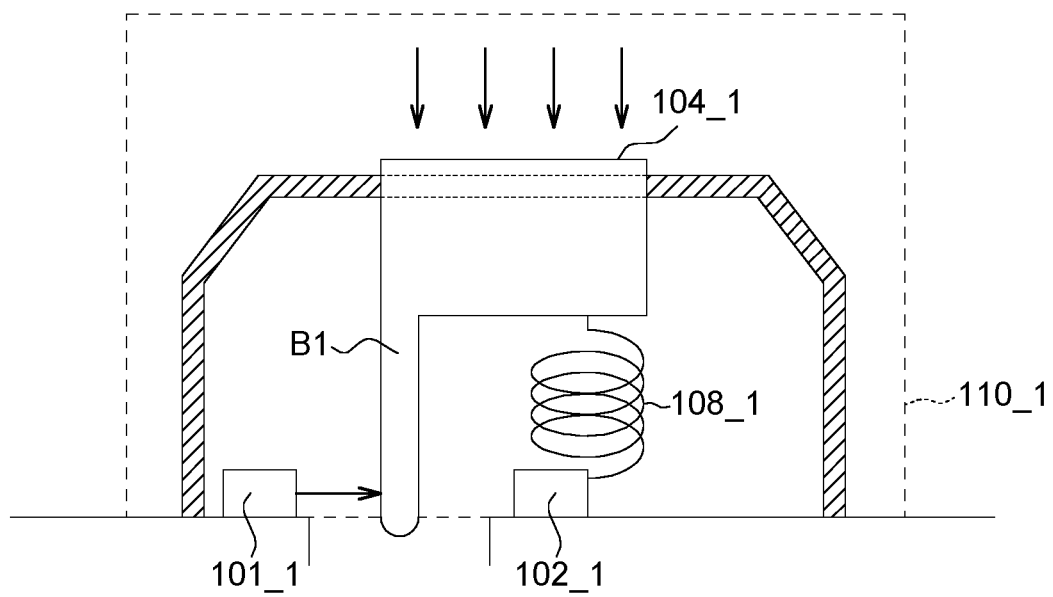
FIG. 2B is a cross-sectional view of the key unit of FIG. 2A in a pressed state.

Referring to FIG. 2B, a cross-sectional view of the key unit 110_1 of FIG. 2A in a pressed state is shown. As shown in FIG. 2B, when the light source 101_1 emits a light according to the first scan signal Scan_1 and the user presses the keycap 104_1, the restoring force element 108_1 under the keycap 104_1 is pressed, and the keycap 104_1 moves downward and synchronically causes the light blocking element B1 disposed under the keycap 104_1 to move downward. Thus, the light blocking element B1 shields the infrared light emitted by the light-emitting diode 101_1 and prevents the infrared light from reaching the phototransistor 102_1, such that the phototransistor 102_1 do not detect the infrared light and becomes turned off, and the first reference voltage Vref1 boosts the voltage of the output terminal PT1 of FIG. 1 to be higher than the 0V voltage of the ground.

Figure 3:
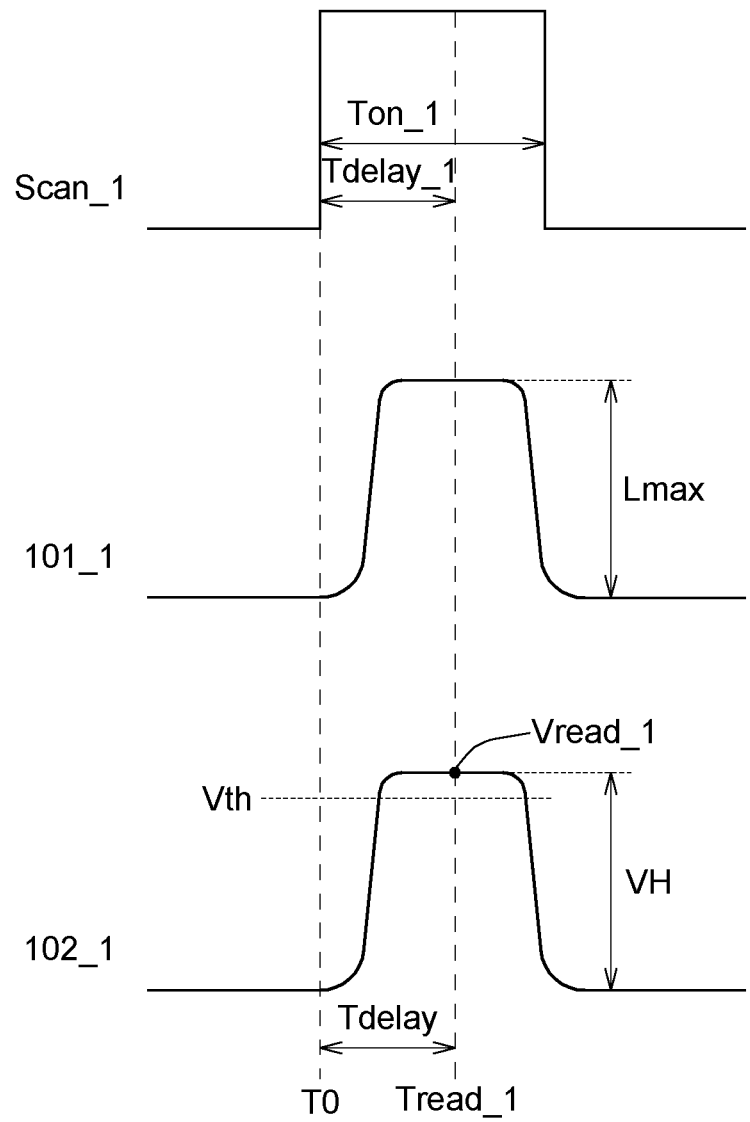
FIG. 3 is a schematic diagram of a normal detecting electric signal and a first read signal voltage corresponding to the key unit of FIG. 2B in a pressed state.

Referring to FIG. 3, a schematic diagram of a normal detecting electric signal and a first read signal voltage Vread_1 corresponding to the key unit 110_1 of FIG. 2B in a pressed state is shown. At the first scan time point T0, the control unit 160 applies a first scan signal Scan_1 to the first scan line 164_1. The first scan signal Scan_1 is a square wave signal which lasts for a first scan period Ton_1. For example, when the scan matrix includes 6 scan lines and 18 read lines, the scan cycle allocated to the first scan line 164_1 is 800 usec, the first scan signal Scan_1, being a square wave signal, has the first scan period Ton_1 of 300 usec. Thus, the total scan time for which the control unit 160 scans the 6 scan lines is 800 usec*6, that is, 4.8 msec. When the total scan time for which the control unit 160 scans the 6 scan lines is smaller than 6 msec, the key drop problem can be avoided. The key drop problem occurs when the user quickly and continuously press a number of key units of the first scan line 164_1, but not all of the pressed key units on the first scan line 164_1 are detected because the interval between the two successive scan operations of the first scan line 164_1 is too long. The light source 101_1 emits a light according to the first scan signal Scan_1, and the light has a maximum luminous intensity Lmax. The detecting element 102_1 detects the light to generate a detecting electric signal, and the detecting electric signal has a maximum voltage VH. The control unit 160 reads the detecting electric signal at a first read time point Tread_1 to obtain a first read signal Read_1. The first read signal Read_1 has the first read signal voltage Vread_1. The first read time point Tread_1 and the first scan time point T0 are separated by an interval of the first delay period Tdelay_1. The first delay period Tdelay_1 can be, for example, 50% to 70% of the first scan period Ton_1. In FIG. 3, the first delay period Tdelay_1 is exemplified by 60% of the first scan period Ton_1 (such as 300 usec), that is, the first delay period Tdelay_1 is 180 usec. When the optical switch keyboard 100 leaves the factory, the illuminating efficiency of the light source 101_1 has not yet decreased, and the light emitted at the corresponding first read time point Tread_1 remains at the maximum luminous intensity Lmax. That is, at a time point being the first scan time point T0 plus the first delay period Tdelay_1, the light emitted by the light source 101_1 remains at the maximum luminous intensity Lmax. Thus, the first read signal voltage Vread_1 obtained from the detecting electric signal read by the control unit 160 at the first read time point Tread_1 is inside the voltage range of the pressed state of the key unit 110_1 (for example, larger than the threshold voltage Vth being 1.5V), and the control unit 160 can correctly determine that the key unit 110_1 currently is in a pressed state.

Figure 4:
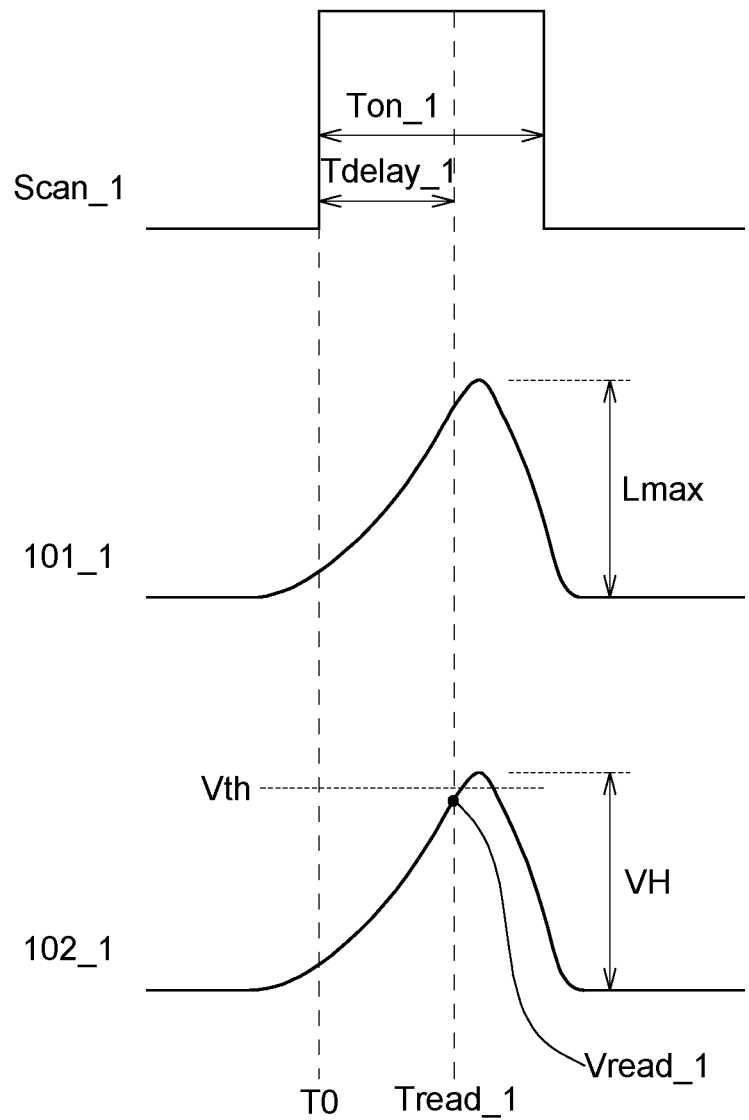
FIG. 4 is a schematic diagram of an abnormal detecting electric signal and a first read signal voltage corresponding to the key unit of FIG. 2B in a pressed state.

Referring to FIG. 4, a schematic diagram of an abnormal detecting electric signal and a first read signal voltage Vread_1 corresponding to the key unit 110_1 of FIG. 2B in a pressed state is shown. Similarly, the control unit 160 applies the first scan signal Scan_1 to the first scan line 164_1 at the first scan time point T0. The first scan signal Scan_1 is a square wave signal which lasts for a first scan period Ton_1. The light source 101_1 emits a light according to the first scan signal Scan_1 and the light still has a maximum luminous intensity Lmax. However, since the optical switch keyboard 100 has been used over a period of time, the illuminating efficiency of the light source 101_1 already decreases, and the light source 101_1 needs to be driven by the first scan signal Scan_1 for a longer duration to achieve the maximum luminous intensity Lmax. Thus, given that the first scan signal Scan_1 is the same, the time when the maximum luminous intensity Lmax outputted by the light source 101_1 is delayed, and the duration for which the light source 101_1 keeps the maximum luminous intensity Lmax is shortened. As shown in FIG. 4, since the time at which the maximum luminous intensity Lmax occurs is delayed and the duration for which the maximum luminous intensity Lmax is kept is shortened, the time point at which the detecting electric signal generated by the detecting element 102_1 reaches the maximum voltage VH is delayed and the duration for which the detecting electric signal keeps the maximum voltage VH is shortened, and the waveform of the detecting electric signal is deteriorated. The waveform of the detecting electric signal is no longer an ideal square waveform. Instead, the waveform of the detecting electric signal is similar to a gentle rising and falling sine wave. When the control unit 160 still reads the detecting electric signal at the first read time point Tread_1 to obtain the first read signal voltage Vread_1, the first read signal voltage Vread_1 is not inside the voltage range of the pressed state of the key unit 110_1 (for example, smaller than the threshold voltage Vth being 1.5V). This will result in that the control unit 160 erroneously determines that the key unit 110_1 currently is not pressed, which makes the optical switch keyboard 100 malfunction. Thus, the method for adjusting an optical switch keyboard of the present disclosure is needed to correct the erroneous determination.

Figure 5:
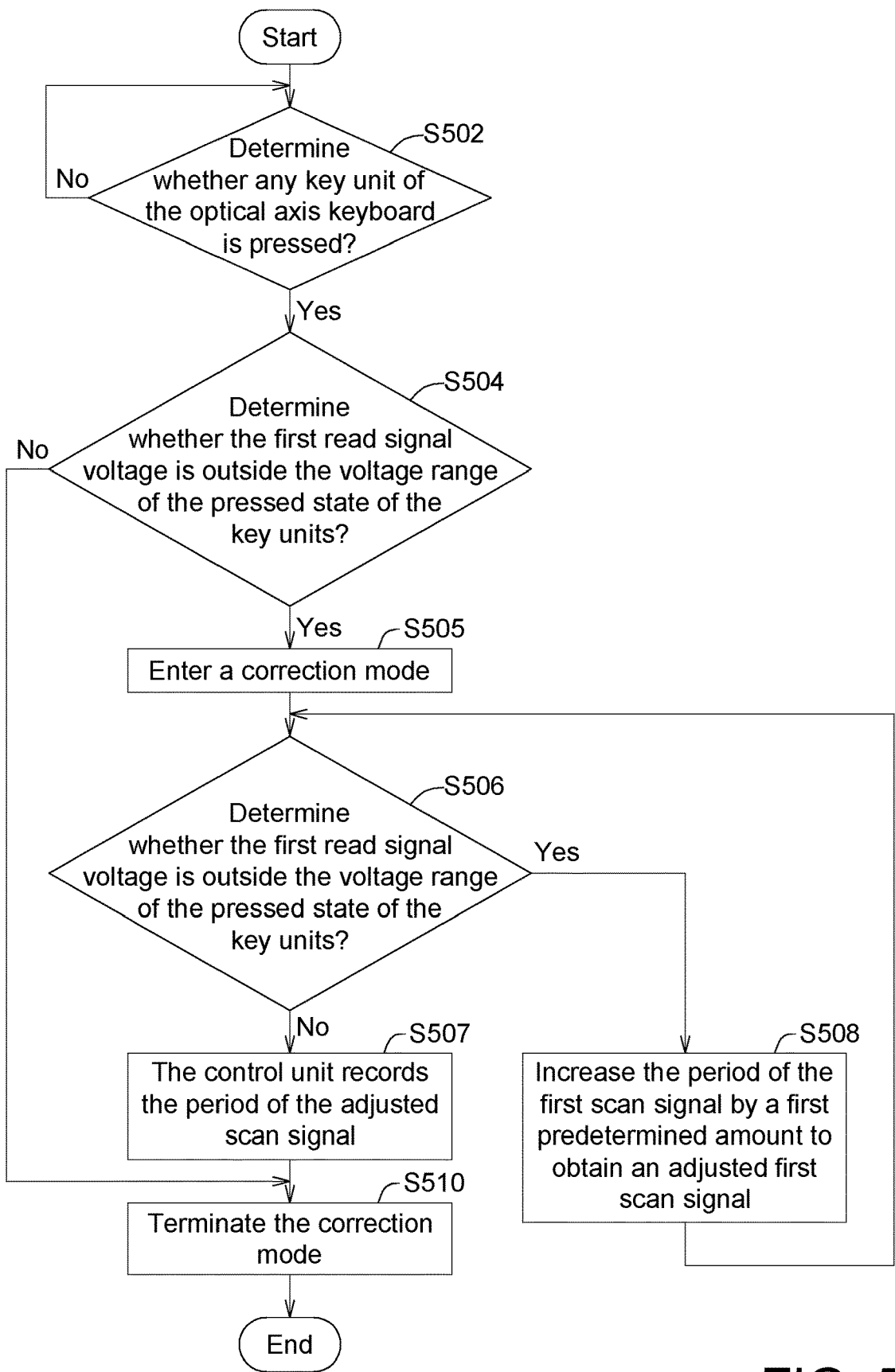
FIG. 5 is a flowchart of a method for adjusting an optical switch keyboard according to a first embodiment of the present disclosure.

Referring to FIG. 5, a flowchart of a method for adjusting an optical switch keyboard 100 according to a first embodiment of the present disclosure is shown. The method includes steps 502 to 510. In step 502, whether anyone key unit of the optical switch keyboard 100 is pressed is determined by the control unit 160 through using an analog-to-digital converter 162. In the description below, the key unit is exemplified by the first key unit 110_1, but the present disclosure is not limited thereto. By the same analogy, the control unit 160 determines whether anyone key unit of the optical switch keyboard 100 is pressed by applying a scan signal to different scan lines at different time points and receiving read signals from different read lines. As shown in FIG. 1 and FIG. 3, when the key unit 110_1 is not pressed, the phototransistor 102_1 detects an infrared light and becomes turned on. Therefore, when reading operation is performed at the first read time point Tread_1, the first read signal voltage Vread_1 read by the analog-to-digital converter 162 is ground voltage 0V. Relatively, when the key unit 110_1 is pressed, the phototransistor 102_1, not detecting the infrared light, becomes turned off, the first reference voltage Vref1 will boost the voltage of the output terminal PT1, and the first read signal voltage Vread_1 read by the analog-to-digital converter 162 becomes higher than 0V. The control unit 160 applies the first scan signal Scan_1 to the first scan line 164_1 at the first scan time point T0 and reads the first read signal voltage Vread_1 from the first read line 166_1 at the first read time point Tread_1 to determine whether the first key unit 110_1 is pressed according to whether the first read signal voltage Vread_1 is higher than 0V. When the determination is yes, then the method proceeds to step 504; otherwise the method stays at step 502. In step 504, whether the first read signal voltage Vread_1 is outside the voltage range of the pressed state of the key units is determined by the control unit 160 through using the analog-to-digital converter 162. For example, the control unit 160 determines whether the first read signal voltage Vread_1 is lower than the threshold voltage Vth of the pressed state, such as 1.5V. When the first read signal voltage Vread_1 is lower than 1.5V, this represents that the voltage is already outside the voltage range of the pressed state of the key units, then step 505 needs to be performed to activate the correction mode of the optical switch keyboard 100. When the first read signal voltage Vread_1 is higher than 1.5V, this represents that the voltage is not outside the voltage range of the pressed state of the key units, then the method is ended and the correction mode will not be activated. In step 505, the optical switch keyboard 100 enters a correction mode. In step 506, whether the first read signal voltage Vread_1 is outside the voltage range of the pressed state of the key units is determined by the control unit 160 through using the analog-to-digital converter 162 (for example, the control unit 160 determines whether the first read signal voltage Vread_1 is lower than the threshold voltage Vth of the pressed state, such as 1.5V). If yes, the method proceeds to step 508; otherwise the method proceeds to step 507. In step 507, the period of the adjusted scan signal is recorded by the control unit 160 and used as a basis for determining the duration for which the control unit 160 applies the first scan signal Scan_1. In step 508, the period of the first scan signal Scan_1 is increased by a first predetermined amount by the control unit 160 to obtain an adjusted first scan signal Scan_1', and after obtaining the adjusted first scan signal Scan_1', the control unit 160 returns to step 506. In step 506, (1) a light is emitted again by the light source 101_1 according to the adjusted first scan signal Scan_1', and (2) whether the first read signal voltage Vread_1 is outside the voltage range of the pressed state of the key units is determined again. The first predetermined amount can be a predetermined percentage of the period of the original first scan signal Scan_1 which has not been adjusted. For example, when the period of the original first scan signal Scan_1 is 300 usec, and each time step 508 is performed once, the adjusted first scan signal Scan_1' is obtained by increasing 10% of the period 300 usec of the original first scan signal Scan_1. That is, each time the period of the adjusted first scan signal Scan_1' is increased by 30 usec. Thus, in the loop of step 506 and step 508, when the first read signal voltage Vread_1 is outside the voltage range of the pressed state of the key units, the control unit 160 increases the period of the scan signal by a first predetermined amount to obtain an adjusted first scan signal Scan_1' until the first read signal voltage Vread_1 insides the voltage range of the pressed state of the key units. In step 510, the optical switch keyboard 100 terminates the correction mode.

Figure 6A:
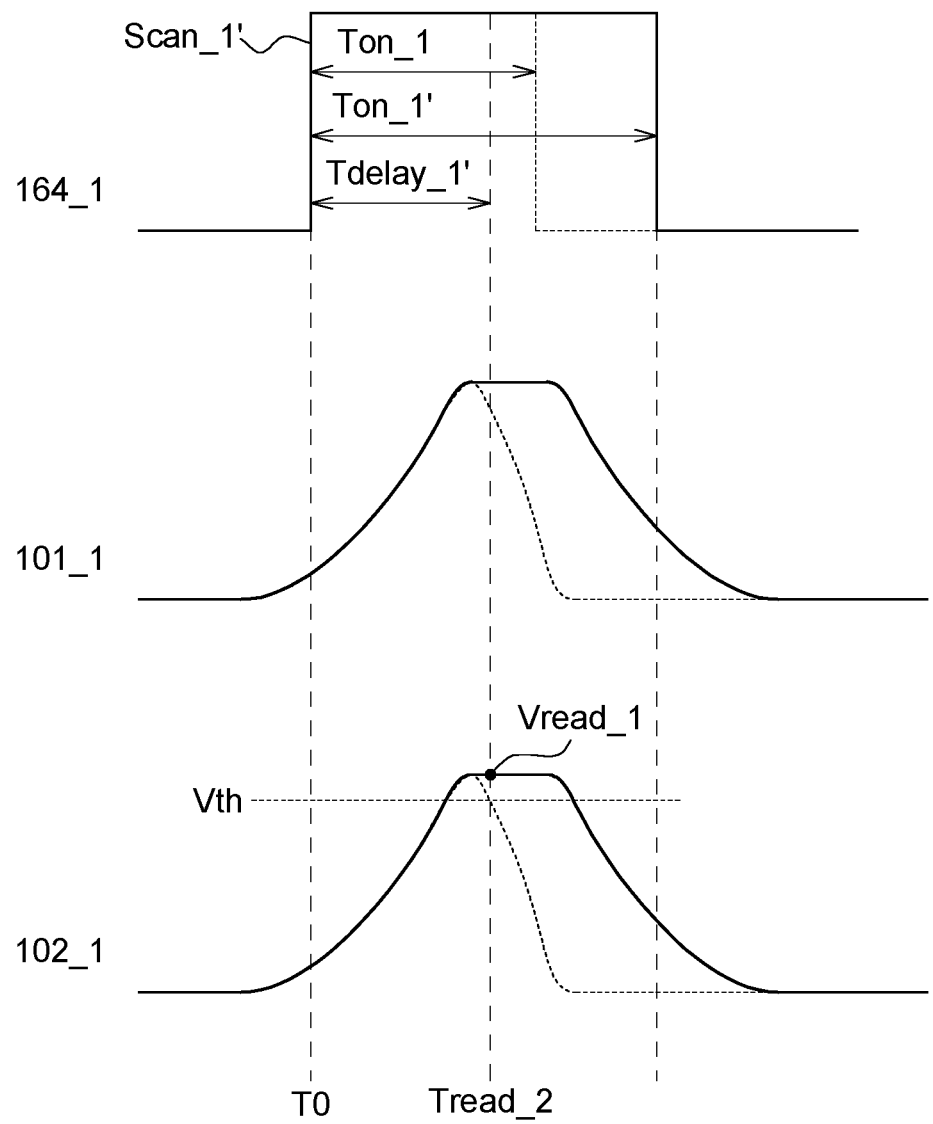
FIG. 6A is a schematic diagram of the detecting electric signal and a first read signal voltage corresponding to an embodiment of the key unit for the method for adjusting an optical switch keyboard of FIG. 5.

Referring to FIG. 6A, a schematic diagram of the detecting electric signal and a first read signal voltage Vread_1 corresponding to an embodiment of the key unit for the method for adjusting an optical switch keyboard of FIG. 5 is shown. The solid line is a schematic diagram of the adjusted detecting electrical signal and the first read signal level Vread_1, and the dashed line is a schematic diagram of the detecting electrical signal and the first read signal voltage Vread_1 before adjustment (the same as FIG. 4). The solid line and the dashed line partially overlap. At the first scan time point T0, the control unit 160 applies the adjusted first scan signal Scan_1' to the first scan line 164_1. The adjusted first scan signal Scan_1' is a square wave signal which has an adjusted first scan period Ton_1'. As shown in FIG. 6A, suppose step 508 has been performed twice and each time when step 508 is performed, the length of the scan period is increased by 30 usec. Therefore, the adjusted first scan period Ton_1' corresponding to the adjusted first scan signal Scan_1' is 360 usec. The light source 101_1 emits a light according to the adjusted first scan signal Scan_1'. Since the illuminating efficiency of the light source 101_1 already decreases, the rising part of the intensity curve of the light emitted by the light source 101_1 is identical to the rising part of the luminous intensity curve of FIG. 4 (the overlapped part of the solid lines and the dotted at the left half of the diagram), the light source needs to be driven by the scan signal for a longer duration to reach the maximum luminous intensity Lmax. After the period of the adjusted first scan signal Scan_1' is increased, the length of the adjusted first scan period Ton_1' is 360 usec. In comparison to the luminous intensity curve of FIG. 4 denoted by dotted lines, the duration for which the light keeps the maximum luminous intensity Lmax is correspondingly increased by 60 usec. The detecting element 102_1 detects the light to generate a detecting electric signal, which has a maximum voltage VH.

As shown in FIG. 6A, corresponding to step 506, the control unit 160 reads the detecting electric signal at the second read time point Tread_2 through using the analog-to-digital converter 162 to obtain a first read signal voltage Vread_1 and further determine whether the first read signal voltage Vread_1 is outside the voltage range of the pressed state of the key units. The second read time point Tread_2 and the first scan time point T0 are separated by an adjusted delay period. That is, after the control unit 160 increases the period of the original first scan signal Scan_1 to obtain an adjusted first scan signal Scan_1', the control unit 160 also increase the length of the first delay period Tdelay_1 by a second predetermined amount to obtain an adjusted first delay period Tdelay_1'. The control unit 160 returns to step 506, and performs again (1) making the light source 101_1 emit a light according to the adjusted first scan signal Scan_1', and (2) reading the detecting electric signal at a time point being the first scan time point T0 plus the adjusted first delay period Tdelay_1', and again determines whether the first read signal voltage Vread_1 is outside the voltage range of the pressed state of the key units. Like the design of FIG. 4, the adjusted first delay period Tdelay_1' can be 50% to 70% of the adjusted first scan period Ton_1', and in FIG. 6A, the adjusted first delay period Tdelay_1' is exemplified by 60% of the adjusted first scan period Ton_1'. That is, the adjusted first delay period Tdelay_1' is 216 usec. Thus, at the second read time point Tread_2, the intensity of the light emitted by the light source 101_1 approximately corresponds to the middle of the period of the maximum luminous intensity Lmax. When the first read signal voltage Vread_1 obtained from the detecting electric signal read by the control unit 160 at the second read time point Tread_2 is inside the voltage range of the pressed state of the key unit 110_1 (for example, larger than the threshold voltage Vth being 1.5V), this represents that the control unit 160 resumes to be able to correctly determine whether the key unit 110_1 is in a pressed state, then the control unit 160 performs step 507 and step 510 to terminate the correction mode. On the other hand, when the first read signal voltage Vread_1 is not located in the period during which the light emitted by the light source 101_1 has the maximum luminous intensity Lmax, this represents that the first read signal voltage Vread_1 may still be outside the voltage range of the pressed state of the key unit 110_1 (for example, the first read signal voltage Vread_1 is still smaller than the threshold voltage Vth being 1.5V). This represents that the control unit 160 still cannot correctly determine whether the key unit 110_1 currently is in a pressed state. Meanwhile, the control unit 160 performs steps 508 to keep the optical switch keyboard 100 in the correction mode. As shown in FIG. 5, each time when the loop of step 506 and step 508 is performed once, the period of the adjusted first scan signal Scan_1' will be increased by 30 usec. The loop of step 506 and step 508 will be performed until at the time point being the first scan time point T0 plus the adjusted first delay period Tdelay_1', the first read signal voltage Vread_1 obtained from the detecting electric signal read by the control unit 160 is inside the voltage range of the pressed state of the key unit 110_1 (for example, larger than the threshold voltage Vth being 1.5V).

Figure 6B:
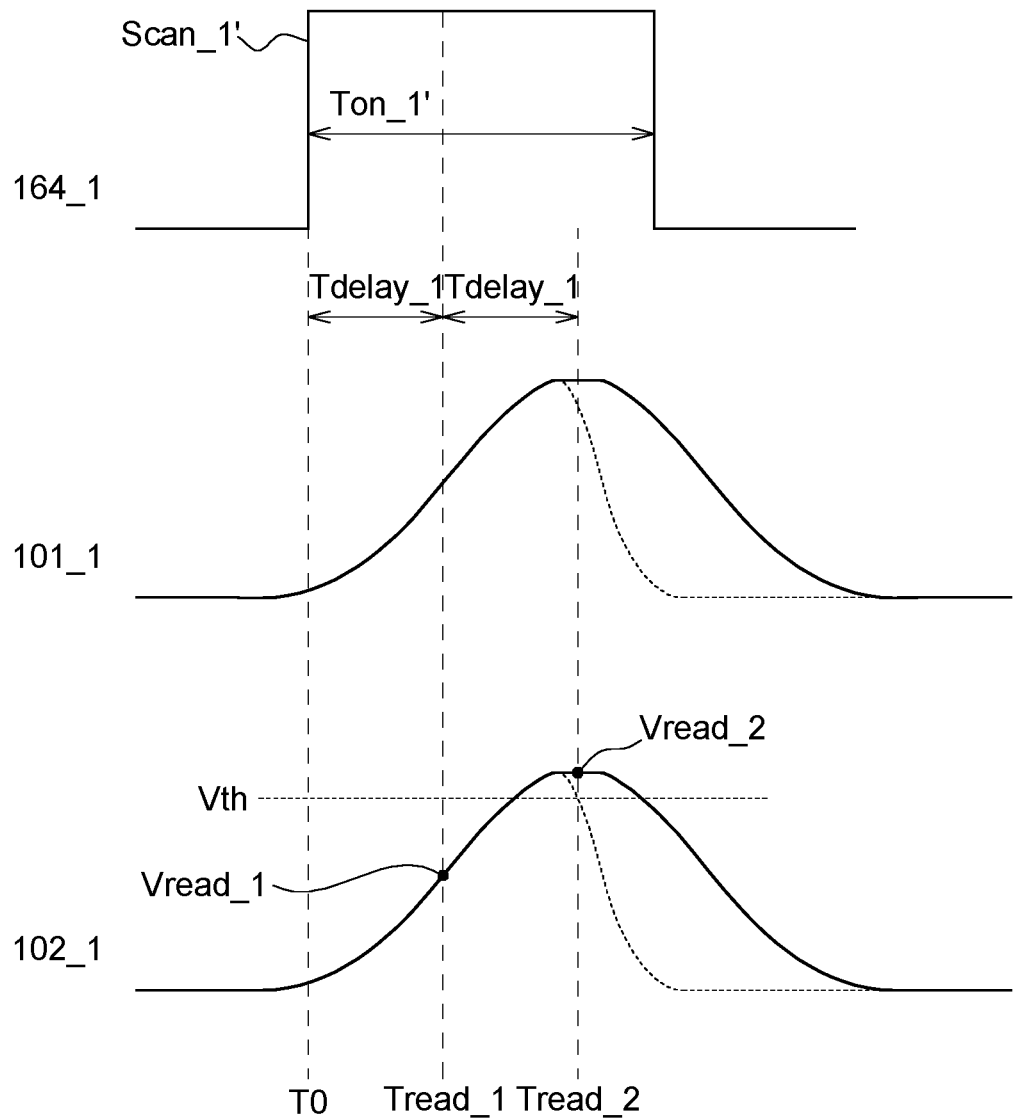
FIG. 6B is a schematic diagram of the detecting electric signal and a first read signal voltage corresponding to another embodiment of the key unit for the method for adjusting an optical switch keyboard of FIG. 5.

Referring to FIG. 6B, a schematic diagram of the detecting electric signal and a first read signal voltage Vread_1 corresponding to another embodiment of the key unit for the method for adjusting an optical switch keyboard of FIG. 5 is shown. Like FIG. 6A, the control unit 160 applies an adjusted first scan signal Scan_1' to a first scan line 164_1 at a first scan time point T0. The adjusted first scan signal Scan_1' is a square wave signal which has an adjusted first scan period Ton_1'. As shown in FIG. 6B, suppose step 508 has been performed twice, and the adjusted first scan period Ton_1' corresponding to the adjusted first scan signal Scan_1' is 360 usec. The light source 101_1 emits a light according to the adjusted first scan signal Scan_1'. Since the illuminating efficiency of the light source 101_1 already decreases, the rising part of the intensity curve of the light emitted by the light source 101_1 is identical to the rising part of the luminous intensity curve of FIG. 4 (the overlapped part of the solid line and the dotted line at the left half of the diagram), the light source needs to be driven by the scan signal having a longer duration to reach the maximum luminous intensity Lmax. After the period of the adjusted first scan signal Scan_1' is increased, the adjusted first scan signal Scan_1' has the adjusted first scan period Ton_1' and the length of the adjusted first scan period Ton_1' is 360 usec. In comparison to the luminous intensity curve of FIG. 4 denoted by dotted lines, the duration for which the light keeps the maximum luminous intensity Lmax is correspondingly increased by 60 usec. The detecting element 102_1 detects the light to generate a detecting electric signal, which has a maximum voltage VH.

As shown in FIG. 6B, corresponding to step 506, after the control unit 160 increases the period of the scan signal, the control unit 160 returns to step 506, and perform again (1) making the light source 101_1 emit a light according to the adjusted first scan signal Scan_1', and (2) reading the detecting electric signal at least twice at a time point being the first scan time point T0 plus a multiple of a real number of the length of the original first delay period Tdelay_1 to obtain at least the first read signal voltage Vread_1 and the second read signal voltage Vread_2. Like FIG. 4, the length of the original first delay period Tdelay_1 is 180 usec, the first scan time point T0 and the first read time point Tread_1 are separated by a delay period of 180 usec, and the first read time point Tread_1 and the second read time point Tread_2 are separated by a delay period of 180 usec. That is, the control unit 160 (1) respectively reads the detecting electric signal at the first read time point Tread_1 being the first scan time point T0 plus the original first delay period Tdelay_1 (such as 180 usec) to obtain a first read signal voltage Vread_1, and (2) reads the detecting electric signal at the second read time point Tread_2 being the first scan time point T0 plus 2 multiple of the original first delay period Tdelay_1 (such as 360 usec) to obtain a second read signal voltage Vread_2. Thus, when the intensity of the light emitted by the light source 101_1 at least one of the first read time point Tread_1 and the second read time point Tread_2 keeps the maximum luminous intensity Lmax, this represents that at least one of the first read signal voltage Vread_1 and the second read signal voltage Vread_2 is inside the voltage range of the pressed state of the key unit 110_1 (for example, larger than the threshold voltage Vth being 1.5V), then the control unit 160 resumes to be able to correctly determine whether the key unit 110_1 is in a pressed state, and the control unit 160 performs step 507 and step 510 to terminate the correction mode. On the other hand, when none of the intensity of the light emitted by the light source 101_1 at the first read time point Tread_1 and the second read time point Tread_2 corresponds to the maximum luminous intensity Lmax, this represents that the first read signal voltage Vread_1 and the second read signal voltage Vread_2 still may be outside the voltage range of the pressed state of the key unit 110_1 (for example, the read signal voltage is higher than 0V but lower than the threshold voltage Vth being 1.5V), and the control unit 160 still cannot correctly determine whether the key unit 110_1 currently is in a pressed state. Meanwhile, the control unit 160 performs step 508 and keep the optical switch keyboard 100 in the correction mode to continuously perform the loop of step 506 and step 508.

In the embodiment of FIG. 6B, the length of the original first delay period Tdelay_1 is 180 usec, and the control unit 160 respective reads the detecting electric signal at the time point being the first scan time point T0 plus 1 multiple and 2 multiple of the original first delay period Tdelay_1 to obtain the read signal voltage twice, but the present disclosure is not limited thereto. The control unit 160 can selectively read the detecting electric signal for several times at time points being the first scan time point T0 plus 1 to N multiple of the original first delay period Tdelay_1 to obtain a number of read signals, wherein N is a real number greater than 1. When the speed of the analog-to-digital converter 162 is fast enough, then N can be 1, 1.4, 1.8 and 2.2. This represents that the control unit 160 reads the detecting electric signal at time points being the first scan time point T0 plus 180 usec, 252 usec, 324 usec and 396 usec respectively to obtain the read signals for 4 times. As shown in FIG. 5, each time the loop of step 506 and step 508 is performed once, the period of the adjusted first scan signal Scan_1' will be increased by 30 usec. The loop is repeated until one of a number of read signal voltages (such as the first read signal voltage Vread_1 to the second read signal voltage Vread_2) read from the detecting electric signal by the control unit 160 is inside the voltage range of the pressed state of the key unit 110_1 (for example, larger than the threshold voltage Vth being 1.5V).

Figure 7:
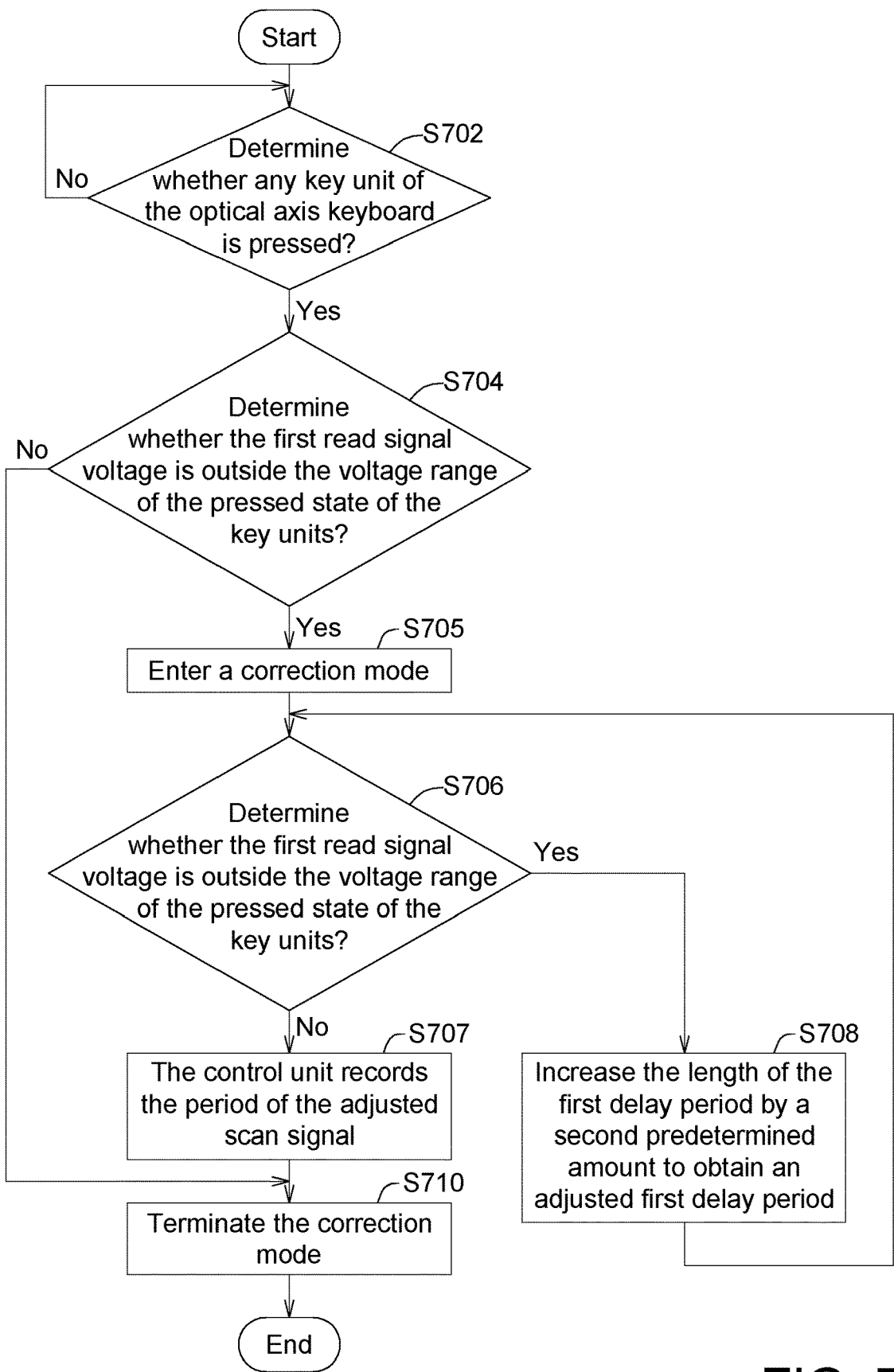
FIG. 7 is a flowchart of a method for adjusting an optical switch keyboard according to a second embodiment of the present disclosure.

Referring to FIG. 7, a flowchart of a method for adjusting an optical switch keyboard 100 according to a second embodiment of the present disclosure is shown. The method includes the following steps 702 to 710. In step 702, whether anyone key unit of the optical switch keyboard 100 is pressed is determined by the control unit 160 through using the analog-to-digital converter 162. In the description below, the key unit 110_1 is taken for example, but the present disclosure is not limited there. By the same analogy, the control unit 160 applies scan signals to different scan lines at different time points and reads read signals from different read lines to determine whether anyone key unit of the optical switch keyboard 100 is pressed. As shown in FIG. 1 and FIG. 3, when the key unit 110_1 is not pressed, the phototransistor 102_1 detects an infrared light and becomes turned on, and reading operation is performed at the first read time point Tread_1. The first read signal voltage Vread_1 read by the analog-to-digital converter 162 has a ground voltage 0V. Relatively, when the key unit 110_1 is pressed, the phototransistor 102_1, not detecting the infrared light, becomes turned off, the first reference voltage Vref1 boosts the output terminal PT1 voltage, and the first read signal voltage Vread_1 read by the analog-to-digital converter 162 becomes higher than 0V. The control unit 160 applies the first scan signal Scan_1 to the first scan line 164_1 at the first scan time point T0 and reads the first read signal voltage Vread_1 from the first read line 166_1 at the first read time point Tread_1 to determine whether the first key unit is pressed according to whether the first read signal voltage Vread_1 is higher than 0V. When the determination is yes, then the method proceeds to step 704; otherwise the method stays at step 702. In step 704, whether the first read signal voltage Vread_1 is outside the voltage range of the pressed state of the key units (for example, lower than the threshold voltage Vth being 1.5V) is determined by the control unit 160 through using the analog-to-digital converter 162. When the determination is yes, this represents that the first read signal voltage Vread_1 is lower than 1.5V and is already outside the voltage range of the pressed state of the key units, then the method proceeds to step 705; otherwise, this represents that the first read signal voltage Vread_1 is higher than 1.5V and is inside the voltage range of the pressed state of the key units (for example, higher than the threshold voltage Vth being 1.5V), and the method is ended. In step 705, the optical switch keyboard 100 enters a correction mode. In step 706, whether the first read signal voltage Vread_1 is outside the voltage range of the pressed state of the key units is determined by the control unit 160 through using the analog-to-digital converter 162. When the determination is yes, then the method proceeds to step 708; otherwise the method proceeds to step 707. In step 707, the length of the adjusted first delay period Tdelay_1' is recorded by the control unit 160 and used as a basis for determining the required length of the delay period according to which the control unit 160 reads the detecting electric signal later. In step 708, the length of the original first delay period Tdelay_1 is increased by a second predetermined amount by the control unit 160 to obtain an adjusted first delay period Tdelay_1', and after obtaining the adjusted first delay period Tdelay_1', the control unit 160 returns to step 706, and performs again (1) emitting a light by the light source 101_1 according to the first scan signal Scan_1, and (2) reading the detecting electric signal by the control unit 160 at a time point being the first scan time point T0 plus the adjusted first delay period Tdelay_1' to obtain a first read signal voltage Vread_1 to determine whether the first read signal voltage Vread_1 is outside the voltage range of the pressed state of the key units. The second predetermined amount can be a predetermined percentage of the length of the original first delay period Tdelay_1 which has not been adjusted. For example, the length of the original first delay period Tdelay_1 is 180 usec, and each time after step 708 is performed, the adjusted first scan signal Scan_1' is obtained by increasing 10% of the length of the original first delay period Tdelay_1. That is, each time after step 708 is performed, the length of the first delay period Tdelay_1 is increased by 18 usec. In step 710, the optical switch keyboard 100 terminates the correction mode.

Figure 8:
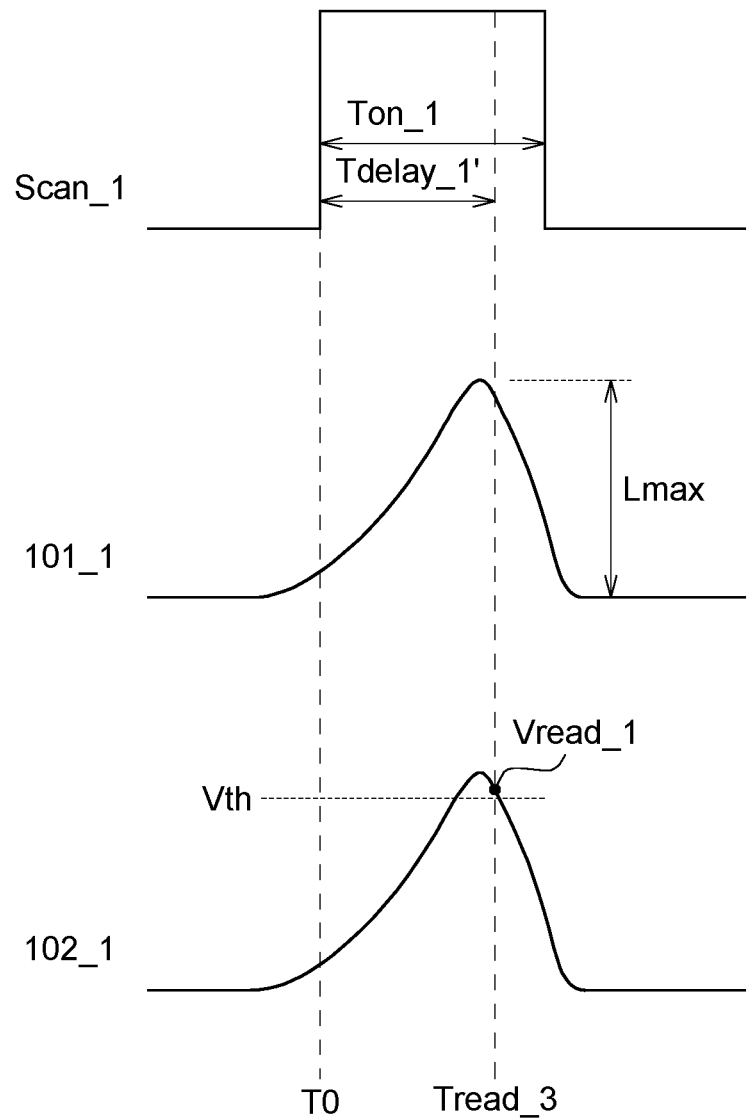
FIG. 8 is a schematic diagram of a detecting electric signal and a first read signal voltage corresponding to an embodiment of the key unit being in a pressed state for the method for adjusting an optical switch keyboard of FIG. 7.

Referring to FIG. 8, a schematic diagram of detecting electric signals and a first read signal voltage Vread_1 corresponding to an embodiment of the key unit being in a pressed state for the method for adjusting an optical switch keyboard 100 of FIG. 7 is shown. The situation of FIG. 8 is similar to the situation of FIG. 4. The control unit 160 applies a first scan signal Scan_1 to the first scan line 164_1 at a first scan time point T0, wherein the first scan signal Scan_1 is a square wave signal which lasts for a first scan period Ton_1. The light source 101_1 emits a light according to the original first scan signal Scan_1. As shown in FIG. 4, since the illuminating efficiency of the light source 101_1 already decreases, the intensity curve of the light emitted by the light source 101_1 of FIG. 8 is identical to the intensity curve of FIG. 4, and the light source needs to be driven by the scan signal having a longer duration to reach the maximum luminous intensity Lmax. The detecting element 102_1 detects the light to generate a detecting electric signal, which has a maximum voltage VH. As shown in FIG. 4, the original first delay period Tdelay_1 is 180 usec, and the first read signal voltage Vread_1 read by the control unit 160 at a time point being the first scan time point T0 plus the delay period 180 usec is smaller than the threshold voltage Vth of the pressed state, that is, 1.5V. As shown in FIG. 8, since the first read signal voltage Vread_1 is smaller than the threshold voltage Vth of the pressed state, that is, 1.5V, the loop of step 706 and step 708 of FIG. 7 has been performed twice, and the adjusted first delay period Tdelay_1' of FIG. 8 is 120% of the original first delay period Tdelay_1. That is, the adjusted first delay period Tdelay_1' is 216 usec.

As shown in FIG. 8, corresponding to step 706, the control unit 160 reads the detecting electric signal at a third read time point Tread_3 to obtain a first read signal voltage Vread_1. The third read time point Tread_3 and the first scan time point T0 are separated by an adjusted first delay period Tdelay_1' (such as 120% of the length of the original first delay period Tdelay_1; that is, 216 usec). That is, the control unit 160 reads the detecting electric signal at a time point being the first scan time point T0 plus 216 usec to obtain a first read signal voltage Vread_1. When the third read time point Tread_3 is located in the period during which the intensity of the light emitted by the light source 101_1 has the maximum luminous intensity Lmax, the first read signal voltage Vread_1 is inside the voltage range of the pressed state of the key unit 110_1 (for example, larger than the threshold voltage Vth being 1.5V), this represents that the control unit 160 resumes to be able to correctly determine whether the key unit 110_1 currently is in a pressed state. Meanwhile, the control unit 160 performs step 707 and step 710 to terminate the correction mode. On the other hand, when the third read time point Tread_3 is still not located in the period during which the intensity of the light emitted by the light source 101_1 has the maximum luminous intensity Lmax, this represents that the first read signal voltage Vread_1 may still be outside the voltage range of the pressed state of the key unit 110_1 (for example, still smaller than the threshold voltage Vth being 1.5V), which represents that the control unit 160 still cannot correctly determine whether the key unit 110_1 is in a pressed state. Meanwhile, the control unit 160 performs step 708 to keep the optical switch keyboard 100 in the correction mode to continuously perform the loop of step 706 and step 708. Thus, each time when the loop of step 706 and step 708 is performed, the length of the adjusted first delay period Tdelay_1' will be increased by 18 usec, and the loop will be repeated until the first read signal voltage Vread_1 is inside the voltage range of the pressed state of the key unit 110_1 (for example, larger than the threshold voltage Vth being 1.5V).

The present disclosure provides an adjusting method. A light is detected by a detecting element to generate a detecting electric signal. The detecting electric signal is read by a control unit 160 at a time point being a first scan time point T0 plus a delay period Tdelay_1 to obtain a first read signal voltage Vread_1. When the first read signal voltage Vread_1 is outside the voltage range of the pressed state of the key unit 110_1, the control unit 160 increases the period of the scan signal Scan_1 by a first predetermined amount to obtain an adjusted scan signal Scan_1' or increases the length of the delay period Tdelay_1 by a second predetermined amount to obtain an adjusted first delay period Tdelay_1'. Thus, under the situation that the illuminating efficiency of the light source decreases and the intensity of the emitted light reduces, the time point at which the control unit 160 of the optical switch keyboard reads the detecting electric signal is delayed through increasing the period of the scan signal Scan_1' or increasing the length of the delay period Tdelay_1, such that whether the key unit 110_1 is pressed can be correctly determined and the problem of the key unit 110_1 being erroneously determined as not being pressed can be avoided.

In summary, under the situation that the illuminating efficiency of the light source decreases and the intensity of the emitted light reduces, whether the key unit is pressed can be correctly determined by the control unit through increasing the period of the scan signal or increasing the length of the delay period for reading the detecting electric signal.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for adjusting an optical switch keyboard having a key unit, comprising:
    applying a scan signal to one of a plurality of scan lines by a control unit at a first scan time point;
    emitting a light by a light source according to the scan signal;
    detecting the light by a detecting element to generate a detecting electric signal;
    reading the detecting electric signal by the control unit to obtain a first read signal voltage;
    wherein when the first read signal voltage is outside a voltage range of the pressed state of the key unit, the control unit increases the period of the scan signal by a first predetermined amount to obtain an adjusted scan signal.

2. The method according to claim 1, wherein when the first read signal voltage is outside the voltage range of the pressed state, the first predetermined amount is a predetermined percentage of the period of the scan signal being unadjusted.

3. The method according to claim 1, wherein the method further comprises: after the adjusted scan signal is obtained, according to the adjusted scan signal, performing the step of emitting the light by the light source according to the scan signal again.

4. The method according to claim 1, wherein when the first read signal voltage is outside the voltage range of the pressed state, the control unit makes the optical switch keyboard activate a correction mode, and when the first read signal voltage is inside the voltage range of the pressed state, the control unit makes the optical switch keyboard terminate the correction mode.

5. The method according to claim 4, wherein the method further comprises: when the first read signal voltage is inside the voltage range of the pressed state and the optical switch keyboard terminates the correction mode, the control unit records the period of the adjusted scan signal.

6. The method according to claim 1, wherein the method further comprises: when the control unit does not increase the period of the scan signal, reading the detecting electric signal by the control unit at a time point being the first scan time point plus a delay period to obtain the first read signal voltage, and after the control unit increases the period of the scan signal, increasing the length of the delay period by a second predetermined amount by the control unit to obtain an adjusted delay period, and performing again (1) the step of emitting the light by the light source according to the scan signal, and (2) the step of reading the detecting electric signal by the control unit at a time point being the first scan time point plus the adjusted delay period.

7. The method according to claim 1, wherein the method further comprises: when the control unit does not increase the period of the scan signal, reading the detecting electric signal by the control unit at a time point being the first scan time point plus a delay period to obtain a first read signal voltage, and after the control unit increases the period of the scan signal, performing again (1) the step of emitting the light by the light source according to the scan signal, and (2) reading the detecting electric signal at least twice by the control unit at a time point being the first scan time point plus a multiple of a real number of the length of the delay period to obtain at least the first read signal voltage and a second read signal voltage.

8. The method according to claim 7, wherein when the first read signal voltage and the second read signal voltage both are outside the voltage range of the pressed state, the optical switch keyboard activates the correction mode, and when at least one of the first read signal voltage and the second read signal voltage is inside the voltage range of the pressed state, the optical switch keyboard terminates the correction mode.

9. A method for adjusting an optical switch keyboard having a key unit, wherein the method comprises:
applying a scan signal to one of a plurality of scan lines by a control unit at a first scan time point;
emitting a light by a light source according to the scan signal;
detecting the light by a detecting element to generate a detecting electric signal;
reading the detecting electric signal by the control unit at a time point being the first scan time point plus a delay period to obtain a first read signal voltage;
wherein when the first read signal voltage is outside a voltage range of the pressed state of the key unit, the control unit increases the length of the delay period by a second predetermined amount to obtain an adjusted delay period.

10. The method according to claim 9, wherein when the first read signal voltage is outside the voltage range of the pressed state, the second predetermined amount is a predetermined percentage of the length of the delay period being unadjusted.

11. The method according to claim 9, wherein the method further comprises: after the adjusted delay period is obtained, according to the adjusted delay period, performing again the step of emitting the light by the light source according to the scan signal and the step of reading the detecting electric signal by the control unit at a time point being the first scan time point plus the adjusted delay period.

12. The method according to claim 9, wherein when the first read signal voltage is outside the voltage range of the pressed state, the control unit makes the optical switch keyboard activate a correction mode, and when the first read signal voltage is inside the voltage range of the pressed state, the control unit makes the optical switch keyboard terminate the correction mode.

13. The method according to claim 12, wherein the method further comprises: when the first read signal voltage is inside the voltage range of the pressed state and the optical switch keyboard terminates the correction mode, recording the length of the adjusted delay period by the control unit.

14. An optical switch keyboard, comprising:
a plurality of scan lines;
a control unit, coupled to the plurality of scan lines, wherein the control unit applies a scan signal to one of the scan lines;
a plurality of key units, wherein any one of the key units comprises:
  a light source, configured to emit a light according to the scan signal; and
  a detecting element, wherein when the detecting element detects the light, the detecting element generates a detecting electric signal, and the control unit reads the detecting electric signal to obtain a first read signal voltage;
wherein when the first read signal voltage is outside a voltage range of the pressed state of one of the key units, the control unit increases the period of the scan signal by a first predetermined amount to obtain an adjusted scan signal.

15. The optical switch keyboard according to claim 14, wherein when the first read signal voltage is outside the voltage range of the pressed state, the first predetermined amount is a predetermined percentage of the period of the scan signal being unadjusted.

16. The optical switch keyboard according to claim 14, wherein after the adjusted scan signal is obtained, the light source emits the light according to the scan signal again.

17. The optical switch keyboard according to claim 14, wherein when the first read signal voltage is outside the voltage range of the pressed state, the control unit makes the optical switch keyboard activate a correction mode, and when the first read signal voltage is inside the voltage range of the pressed state, the control unit makes the optical switch keyboard terminate the correction mode.

18. The optical switch keyboard according to claim 17, wherein when the first read signal voltage is inside the voltage range of the pressed state and the optical switch keyboard terminates the correction mode, the control unit records the period of the adjusted scan signal.

19. The optical switch keyboard according to claim 14, wherein when the control unit does not increase the period of the scan signal, the control unit reads the detecting electric signal at a time point being the first scan time point plus a delay period to obtain a first read signal voltage, and after the control unit increases the period of the scan signal, the control unit increases the length of the delay period by a second predetermined amount to obtain an adjusted delay period, and performs again (1) the step of emitting the light by the light source according to the scan signal, and (2) the step of reading the detecting electric signal by the control unit at a time point being the first scan time point plus the delay period.

20. The optical switch keyboard according to claim 14, wherein when the control unit does not increase the period of the scan signal, the control unit reads the detecting electric signal at the first scan time point plus a delay period to obtain a first read signal voltage, and after the control unit increases the period of the scan signal, the followings are performed again: (1) the step of emitting the light by the light source according to the scan signal, and (2) reading the detecting electric signal by the control unit at least twice at a time point being the first scan time point plus a multiple of a real number of the length of the delay period to obtain at least the first read signal voltage and a second read signal voltage.

21. The optical switch keyboard according to claim 20, wherein when the first read signal voltage and the second read signal voltage both are outside the voltage range of the pressed state, the optical switch keyboard activates the correction mode, and when at least one of the first read signal voltage and the second read signal voltage is inside the voltage range of the pressed state, the optical switch keyboard terminates the correction mode.

22. The optical switch keyboard according to claim 14, wherein the control unit includes an analog-to-digital conversion circuit, and the control unit reads the detecting electric signal through the analog-to-digital conversion circuit.

23. An optical switch keyboard, comprising:
a plurality of scan lines;
a control unit, coupled to the plurality of scan lines, wherein the control unit applies a scan signal to one of the scan lines at a first scan time point;
a plurality of key units, wherein any one of the key units comprises:
  a light source, configured to emit a light according to the scan signal; and
  a detecting element, wherein when the detecting element detects the light, the detecting element generates a first read signal voltage;
wherein the control unit reads the first read signal voltage at a second time point, the second time point and the first scan time point are separated by a delay period, and when the first read signal voltage is outside a voltage range of the pressed state of one of the key units, the control unit increases the length of the delay period by a second predetermined amount to obtain an adjusted delay period.

24. The optical switch keyboard according to claim 23, wherein when the first read signal voltage is outside the voltage range of the pressed state, the second predetermined amount is a predetermined percentage of the length of the delay period being unadjusted.

25. The optical switch keyboard according to claim 23, wherein after the adjusted delay period is obtained, the light source emits the light again according to the scan signal, and the control unit reads the detecting electric signal at a time point being the first scan time point plus the adjusted delay period.

26. The optical switch keyboard according to claim 23, wherein when the first read signal voltage is outside the voltage range of the pressed state, the control unit makes the optical switch keyboard activate a correction mode, and when the first read signal voltage is inside the voltage range of the pressed state, the control unit makes the optical switch keyboard terminate the correction mode.

27. The optical switch keyboard according to claim 26, wherein when the first read signal voltage is inside the voltage range of the pressed state and the optical switch keyboard terminates the correction mode, the control unit records the length of the adjusted delay period.

* * * * *